(12) United States Patent
Shahar et al.

(10) Patent No.: US 12,123,473 B2
(45) Date of Patent: Oct. 22, 2024

(54) SYSTEM, DEVICE, AND METHOD OF PROTECTING SENSITIVE EQUIPMENT AGAINST VIBRATIONS AND EARTHQUAKES

(71) Applicant: Dynamica Design Ltd., Kfar Vitkin (IL)

(72) Inventors: Rami Shahar, Kfar Vitkin (IL); Jacob Glaubman, Raanana (IL); Anatoly Kovadlo, Moshav Ometz (IL)

(73) Assignee: DYNAMICA DESIGN LTD., Kfar Vitkin (IL)

( * ) Notice: Subject to any disclaimer, the term of this patent is extended or adjusted under 35 U.S.C. 154(b) by 230 days.

(21) Appl. No.: 17/748,333

(22) Filed: May 19, 2022

(65) Prior Publication Data

US 2022/0373059 A1    Nov. 24, 2022

Related U.S. Application Data

(60) Provisional application No. 63/190,840, filed on May 20, 2021.

(51) Int. Cl.
*F16F 15/02*    (2006.01)
*F16M 1/00*    (2006.01)
*H05K 7/14*    (2006.01)

(52) U.S. Cl.
CPC ............... *F16F 15/02* (2013.01); *F16M 1/00* (2013.01); *H05K 7/1495* (2013.01)

(58) Field of Classification Search
CPC .......... F16F 7/14; F16F 15/02; H05K 7/1495; F16M 1/00; E04H 9/14

(Continued)

(56) References Cited

U.S. PATENT DOCUMENTS 2,812,989 A * 11/1957 Carter ................ F16F 15/02
                                                        108/65
3,556,446 A * 1/1971 Bochan .................. D06F 37/24
                                                        210/364

(Continued)

FOREIGN PATENT DOCUMENTS

GB            2389571 A * 12/2003 ........... H05K 7/1488
KR     20230068275 A * 5/2023 ........... H05K 7/1495

(Continued)

*Primary Examiner* — Taylor Morris
(74) *Attorney, Agent, or Firm* — BROWDY AND NEIMARK, P. L. L. C.

(57) ABSTRACT

Systems, devices, and methods of protecting sensitive equipment against vibrations, mechanical shocks, and earthquakes. A support device includes a lower fixed or non-moving frame, and an upper movable frame. The two frames are connected via four dampers, at or near their four corners; and also by four generally-vertical cables or wires that together with the supported device operate as an inverted pendulum or an upside-down pendulum in response to incoming vibrations or applied forces. The dampers, as well as the inverted pendulum created by the cables, dissipate and absorb vibration energy and mechanical shocks. Optionally, the entirety of the support device has not more than four dampers. Optionally, the entirety of the support device has or not more than eight dampers, wherein four of the eight dampers are not connected to the vertical cables, and four other of the eight dampers are connected to lower ends of the four vertical cables.

19 Claims, 6 Drawing Sheets

(58) Field of Classification Search
USPC .......................................................... 248/638
See application file for complete search history.

(56) References Cited

U.S. PATENT DOCUMENTS

| | | | | |
|---|---|---|---|---|
| 3,578,278 A * | 5/1971 | Pickering | ............ | F16F 15/0275 |
| | | | | 248/631 |
| 3,606,704 A * | 9/1971 | Denton | ............. | E04F 15/02452 |
| | | | | 403/138 |
| 3,908,940 A * | 9/1975 | Van Der Stricht | ..... | F16F 15/02 |
| | | | | 248/561 |
| 3,949,878 A * | 4/1976 | Doane | ................... | F16F 15/02 |
| | | | | 206/386 |
| 4,718,206 A * | 1/1988 | Fyfe | ......................... | F16F 1/50 |
| | | | | 248/634 |
| 4,766,708 A * | 8/1988 | Sing | ......................... | E04B 1/98 |
| | | | | 52/167.2 |
| 4,850,261 A * | 7/1989 | Greene | ................ | G05D 19/02 |
| | | | | 248/638 |
| 4,860,507 A * | 8/1989 | Garza-Tamez | .......... | E02D 27/34 |
| | | | | 248/560 |
| 5,520,029 A * | 5/1996 | Savkar | .................... | D06F 37/24 |
| | | | | 68/23.1 |
| 5,813,650 A * | 9/1998 | Tsukamoto | ............. | F16F 15/04 |
| | | | | 248/638 |
| 6,209,841 B1 * | 4/2001 | Houghton, Jr. | ......... | F16F 15/04 |
| | | | | 267/136 |
| 6,511,035 B1 * | 1/2003 | Teel | ........................ | F16F 15/02 |
| | | | | 248/550 |
| 7,114,692 B2 * | 10/2006 | Sun | ......................... | F16F 15/02 |
| | | | | 248/550 |
| 10,098,248 B1 * | 10/2018 | Klinger | ................ | H05K 7/1495 |
| 2019/0136564 A1 * | 5/2019 | Martín Hernández | | ..................... |
| | | | | E04H 9/021 |

FOREIGN PATENT DOCUMENTS

| | | | | |
|---|---|---|---|---|
| SE | 437314 B | * | 2/1985 | ............... H02B 1/54 |
| WO | WO-2018182548 A2 | * | 10/2018 | ............. E04F 15/00 |

* cited by examiner

SYSTEM, DEVICE, AND METHOD OF PROTECTING SENSITIVE EQUIPMENT AGAINST VIBRATIONS AND EARTHQUAKES

CROSS-REFERENCE TO RELATED APPLICATIONS

This patent application claims benefit and priority from U.S. 63/190,840, filed on May 20, 2021, which is hereby incorporated by reference in its entirety.

FIELD

Some embodiments are related to the field of mechanical devices for absorbing vibrations and mechanical shocks.

BACKGROUND

Billions of people use electronic devices on a daily basis. For example, people use smartphones, tablets, laptop computers, desktop computers, and other electronic devices to perform a variety of activities and tasks. People use electronic devices, for example, to browse the Internet, to consume digital content, to watch streaming videos, to listen to streaming audio, to send and receive electronic mail (email) messages, to engage in phone calls and in video conferences, to perform electronic commerce (e-commerce) activities and online purchases, to post updates on social networks, to play games, or the like.

Millions of computer servers and other equipment are distributed all over the world, to facilitate the serving of data to such electronic devices, or to enable the exchange of data among such electronic devices. Such equipment includes, for example, computer servers, web servers, application servers, cloud-based computing servers, cloud-based storage units and data repositories, switches, hubs, routers, network elements, or the like.

Sometimes, several such servers or equipment items are stored within an open cabinet or a closed cabinet, known as a rack. Sometimes, hundreds of such servers or other equipment items are co-located inside a single building or structure, known as a data center; and are managed or maintained by a data center owner or operator.

SUMMARY

Some embodiments provide systems, devices, and methods of protecting sensitive equipment against vibrations and earthquakes. For example, a support device includes a lower fixed or non-moving frame, and an upper movable frame; they are connected via dampers or damping units (e.g., at the four corners), and also by cables or wires that together with the supported device (e.g., an equipment rack) operate as an inverted pendulum or an upside-down pendulum. The dampers, as well as the inverted pendulum created by the cables, dissipate and/or absorb vibration energy and/or mechanical shocks.

Some embodiments may provide other and/or additional advantages and/or benefits.

DETAILED DESCRIPTION OF SOME DEMONSTRATIVE EMBODIMENTS

The Applicants have realized that computer servers, telecommunication equipment, storage devices, racks, computer racks, computer cabinets, and other equipment may be sensitive to vibrations or mechanical shocks or earthquakes. For example, even a low magnitude earthquake may cause vibrations that may suffice to tip-over a tall rack of electronic equipment and to damage it, or to cause breaking or cracking of equipment, or to cause disconnection of cables or plugs. Similarly, a heavy thunderstorm may cause similar vibrations that may damage equipment. In some situations, a heavily loaded truck passing by (e.g., on a road next to a data center) may also cause damaging vibrations to some sensitive equipment.

The Applicants have realized that racks and equipment may be placed (or connected, or mounted) on top of a Solid Floor or a Raised Floor. When a solid floor is used, the racks or equipment are placed directly onto the floor, which may be formed of cement, bricks, metal, wood, or other material. When a raised floor is used, there exists a vertical gap between a top-layer floor (the Raised Floor layer) and the bottom-layer floor beneath it (the Base Floor layer), and such gap is often used for routing of electric wires, networking cables, or the like. The Applicants have realized that in both types of floors, there exist risks and possible damage to sensitive equipment from vibrations or shaking of structures.

In accordance with some embodiments, computer servers, equipment racks, and other vibration-sensitive equipment may be stored on top of a particular device or sub-system that operates to protect the vibration-sensitive equipment from vibrations or shaking, including from irregular vibrations (e.g., due to an earthquake, due to a thunderstorm) and from regular vibrations (e.g., due to a passing truck; or due to a person dropping a heavy load onto a raised floor nearby).

In some embodiments, the mechanism for protecting the equipment against vibrations and shaking, may be an autonomous device or an independent device; such as, an autonomous pedestal or an autonomous support unit, which may be placed on the base floor or on the raised floor, and/or which may be connected to the base floor or to the raised floor; and the equipment or the rack may then be placed or mounted on top of such autonomous pedestal or an autonomous support unit, or, the equipment or the rack may then be attached or connected (e.g., with screws, with bolts, with connectors) on top of such autonomous pedestal or an autonomous support unit.

In other embodiments, the vibration-protecting element or support member may be implemented as an integrated part or an integrated component of a rack or a cabinet or other storage unit, particularly as an integrated part of the lower region of such rack or a cabinet or storage unit; such that, for example, a supplier may produce and sell an integrated cabinet-with-support-member or rack-with-support-member, as a single integrated product that performs both functionalities, e.g., (i) storage and/or housing and/or holding and/or enclosure of the equipment, and (ii) protection of the equipment against vibrations or shaking.

In accordance with some embodiments, the vibration-protecting element may include, or may be implemented as, one or more pedestals or base elements or base units; optionally having one or more integrated elastic elements and/or dampers and/or damping units. The elastic elements and/or the damping units operate to decouple or to absorb vibration energy and/or vibrations and/or mechanical shocks and/or mechanical movements, and/or they may operate as a filter or a buffer or a separator or as a buffer zone which absorbs forces and shocks and/or dissipates forces and shocks and/or otherwise reduces vibration levels or shocks or incoming forces, particularly vibrations that are above a particular frequency introduced by or from the floor (e.g., the raised floor, or the base floor, or both floors, or from a single ground floor if no raised floor is used) towards the equipment rack.

Some embodiments may be used in conjunction with any suitable type of floor, including a raised floor, and including a solid floor or a non-raised floor. For example, for raised floors installations, the bottom of the rack may be leveled close to the level of the surrounding raised floor; and the height of the raised floor generally defines the height of the pedestals with the integrated elastic elements and/or damping units. For non-raised floor installations, the rack may be placed (or mounted, or connected, or attached) on a supporting frame or support member, with the integrated elastic elements and/or damping units.

Figure 1:
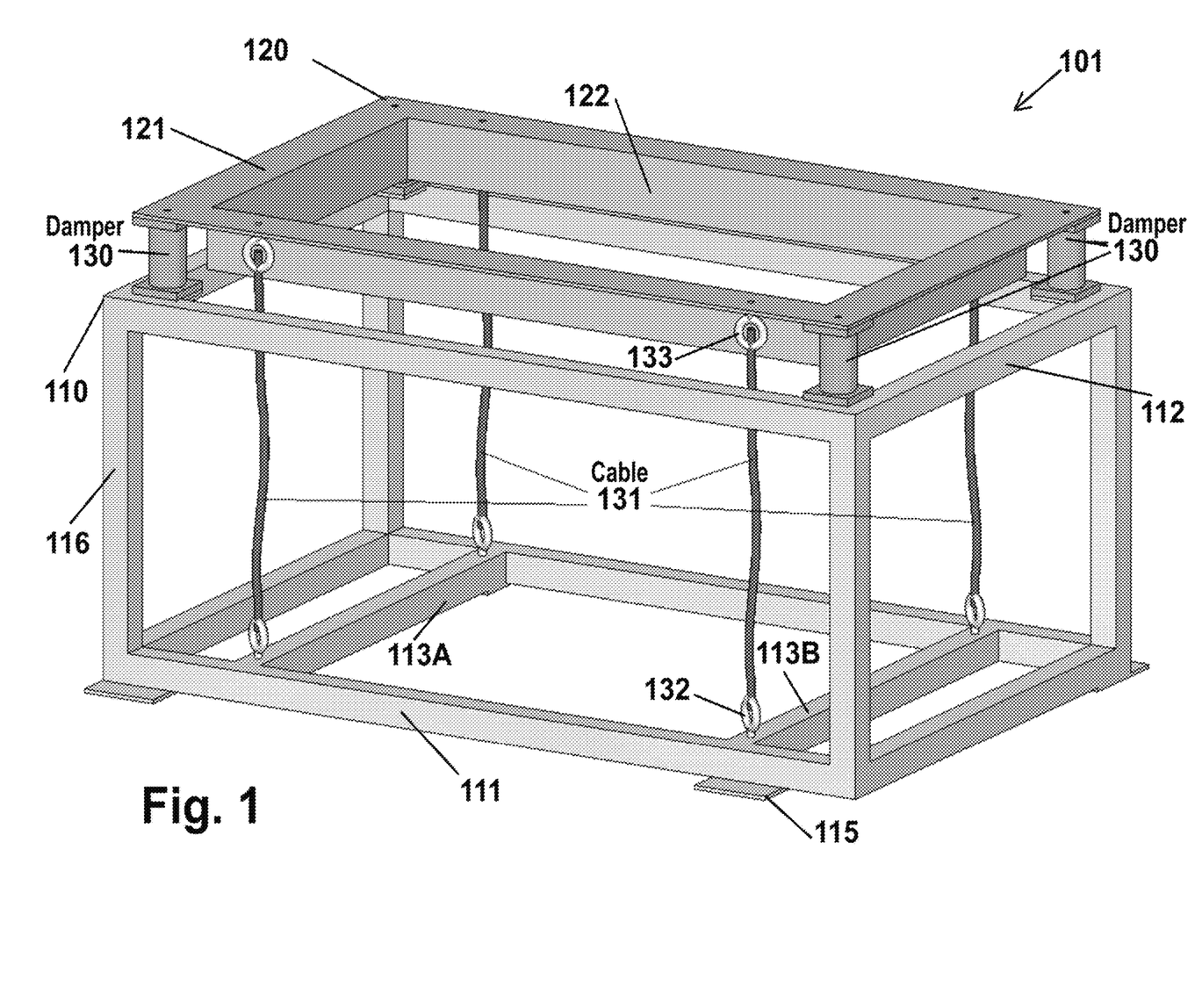
FIG. 1 is a schematic illustration of a Support Device, in accordance with some demonstrative embodiments.

Reference is made to FIG. 1, which is a schematic illustration of a Support Device 101, in accordance with some demonstrative embodiments. Support Device 101 may include a fixed non-moving hollow box 110, and an upper movable frame 120.

The fixed non-moving hollow box 110 may be formed of metal. It includes four horizontal bars 111 that are parallel to the ground and that are connected to form a bottom-side rectangular metal frame; it further includes four horizontal bars 112 that are parallel to the ground and that are connected to form an upper-side rectangular metal frame; and it further includes four vertical bars 116, that are perpendicular to the ground and that connect the bottom-side rectangular metal frame and the upper-side rectangular metal frame.

Two cross-bars 113A and 113B are connected within the bottom-side rectangular metal frame. For demonstrative purposes, two such cross-bars 113A and 113B are shown; however, some embodiments may optionally include three or four or other number of such cross-bars 113A and 113B. The cross-bars 113A and 113B are horizontal, and are parallel to the ground, and are parallel to each other. The cross-bars 113A and 113B are also parallel to the two shorter edges out of the four edges of the bottom-side rectangular metal frame.

The upper movable frame 120 includes four horizontal metal bars 121, that are horizontal and that are parallel to the ground; and that are connected to form a metal rectangular frame or that is parallel to the ground. The upper movable frame 120 further includes four vertical panels 122, each such vertical panel 122 is connected perpendicularly to a corresponding horizontal metal bar 121. As shown, each vertical panel 122 is connected to an inner edge of the corresponding horizontal metal bar 121, rather than to an outer edge of the corresponding horizontal metal bar 121. Additionally, each vertical panel 122 is also connected, perpendicularly, to two neighboring vertical panels 122; such that the four vertical panels 122 form a rectangular frame. As shown, the rectangular frame formed by the four vertical panels 122, is smaller than the rectangular frame formed by the four horizontal metal bars 121, and is internal relative to the rectangular frame formed by the four horizontal metal bars 121. This particular structure is functionally significant, as it allows the connection of stabilizing and vibration-absorbing cables 131 as described herein, and/or as it allows the connection of corner-located dampers 130 as described herein.

Four dampers 130 are located at four corners of the structure: each damper 130 is located on top of a corner region of the fixed non-moving hollow box 110, and beneath or under a corresponding corner region of the upper movable frame 120. Each damper 130 may be formed of, or may comprise, an elastic material, a flexible material, a rigid-flexible material that provides some rigidity but also some flexibility, a spring, a metal spring, a set of springs, or other damping unit able to absorb or dissipate energy or excess energy or kinetic energy or vibration-based energy or energy caused due to movement of one or more components of Support Device 101 due to vibrations or shaking or external mechanical forces.

In some embodiments, optionally, one or more of the dampers 130 may be implemented as a dap-shot damper or as a piston damper, or as a cylinder containing a movable piston that is immersed in a viscous fluid (e.g., oil, or oily liquid), wherein external force or impact or vibration or shaking cause movement of the piston within the viscous fluid within the cylinder and thus dissipates the excess energy.

Four vertical or generally-vertical cables 131 are connected, vertically or generally-vertically, between the non-moving hollow box 110 the upper movable frame 120. The lower end of each vertical cable 131 is connected to a lower-side connector 132 (e.g., a metal ring, or other ring-shaped element or hollow element); two lower-side connectors 132 are located on top of horizontal cross-bar 113A, and two other lower-side connectors 132 are located on top of horizontal cross-bar 113B. Each of the lower-side connectors 132 is located slightly inwardly relative to the edge or the ending of the respective horizontal cross-bar 113A; such that each of the lower-side connectors 132 is away from, and is not on top of, any of the four horizontal metal bars 111. This particular combination of location and structure is significant, as it allows each cable 131 to extend upwardly within the bottom-side rectangular frame of the fixed non-moving hollow box 110.

Each cable 131 is further connected to a corresponding upper-side connector 131. Each of the upper-side connectors 131 is located at (or connected to) one of the two elongated (or longer) edges of the vertical panels 122 of the upper movable frame 120. For example, two of the upper-side connectors 131 are connected to one of the two longer vertical panels 122 of the upper movable frame 120; and two other of the upper-side connectors 131 are connected to the opposite vertical panel 122 of the upper movable frame 120; and no upper-side connectors 131 are connected to the two shorter vertical panels 122 of the four vertical panels 122 of the upper movable frame 120.

Each of the vertical cables 131 is formed of a metal wire, or of a braid or set of metal wires; and is able to operate as an upside-down pendulum or as an inverted pendulum; thereby absorbing or dissipating energy or kinetic energy or excess energy or vibration-based energy or incoming forces or vibrations that may be applied to Support Device 101. For example, a vibration or shaking of Support Device 101 (and/or of a rack or equipment that is placed or mounted thereon), may cause the four cables 131 (or at least one of them, or at least some of them) to move as an upside-down pendulum, wherein the lower end of the cable 131 remains fixed and generally non-moving, and wherein the upper end of the cable 131 moves sideways (e.g., left and right), and causes slight movement (e.g., sideways) of the upper movable frame 120.

In some embodiments, in response to regular or daily vibrations (e.g., from a passing truck; or from dropping a heavy load on the floor nearby), or in response to a low-magnitude earthquake or seismic activity, the cables 131 are not under tension, and do not yet move as inverted pendulums; but rather, the dampers 130 provide multi-directional elastic support which is sufficient to absorb the energy of such vibrations or shaking.

In some embodiments, the cables 131 provide additional contribution to absorption of vibration-based energy in situations where the vibrations are of a higher magnitude (e.g., a high magnitude earthquake), when the amplitude of the vibration of the lower rectangular frame of the Support Unit 101 exceed a predetermined threshold value of hazardous amplitude. The inverted pendulum mechanism, in which the lower ends of the cables 131 are fixed and the upper ends of the cables 131 are moving, enables improvement or optimization of vibration absorption or force dissipation, and/or enables to utilize a relatively small number of dampers 130 (e.g., four corner-located dampers 130; compared to conventional damping elements that utilize 16 or 18 springs or dampers or elastic elements). In accordance with some embodiments, the unique sub-systems of four vertical cables 131, located inwardly relative to the external metal frame of the fixed non-moving hollow box 110, and located inwardly relative to the upper movable frame 120, may prevent tipping-over or tip-over or falling of the equipment (e.g., rack, cabinet) that is placed or mounted on top of the Support Device 101.

Some embodiments thus provide a combined system of protection for vibration-sensitive equipment, data racks, computer racks, equipment rack, or any dynamically sensitive payload from everyday environmental vibrations as well as from earthquakes and from irregular vibrations or mechanical shocks. The system includes fixed and moveable frames, corner elastic elements with damping, and strong cables or wires that operate as inverted pendulums or as upside-down pendulums.

The system includes two components that operate in parallel to each other: a set of multi-directional elastic support members or support elements with the required levels of elasticity and damping, and a sub-system to prevent the equipment from turnover or tip-over or falling.

In some embodiments, to prevent equipment turnover or tipping-over or falling, a plurality of vertical or generally-vertical cables or wires are used. These cables or wires are connected: at their lower end, to the fixed frame; and at their upper end, to the top-side movable frame. The cables 131, together with the moveable frame and the equipment mounted on top of it, operate as an inverted pendulum.

Some embodiments thus utilize a combination of: (i) non load carrying (or non load bearing) cables forming an inverted pendulum mechanism, and (ii) load carrying (or load bearing) elastics elements or flexible elements or rigid-flexible elements or springs or dampers or damping units; wherein the vertical cables of the inverted pendulum are normally and regularly not under tension; wherein the cables 131 provide functionality of multi-directional movement of the upper movable frame, in addition the multi-directional movement capability that is provided by the elastic elements or dampers.

In some embodiments, the entire Support Device 101 comprises exactly four dampers 130, located on top of the four corners of the fixed non-moving hollow box 110, and located beneath the four corners of the upper movable frame 120; and these four dampers 130 may suffice, in combination with the upside-down pendulum mechanism of the four cables 131, to absorb and dissipate vibrations energy and mechanical shocks energy. This is in contrast with conventional support units for racks of equipment, which typically required 16 or 18 or more springs or dampers, distributed along numerous locations of a support frame, and/or located at non-corner locations of a support frame.

In some embodiments, the degree or the magnitude of free movement of the payload that is mounted on Support Device 101, may be determined or configured by configuring accordingly the length of each cable 131; to enable free movement of up to N centimeters, and to restrain movement beyond such threshold; wherein N is a pre-defined value that can be configured by configuring or setting the length of each cable 131.

Figure 2:
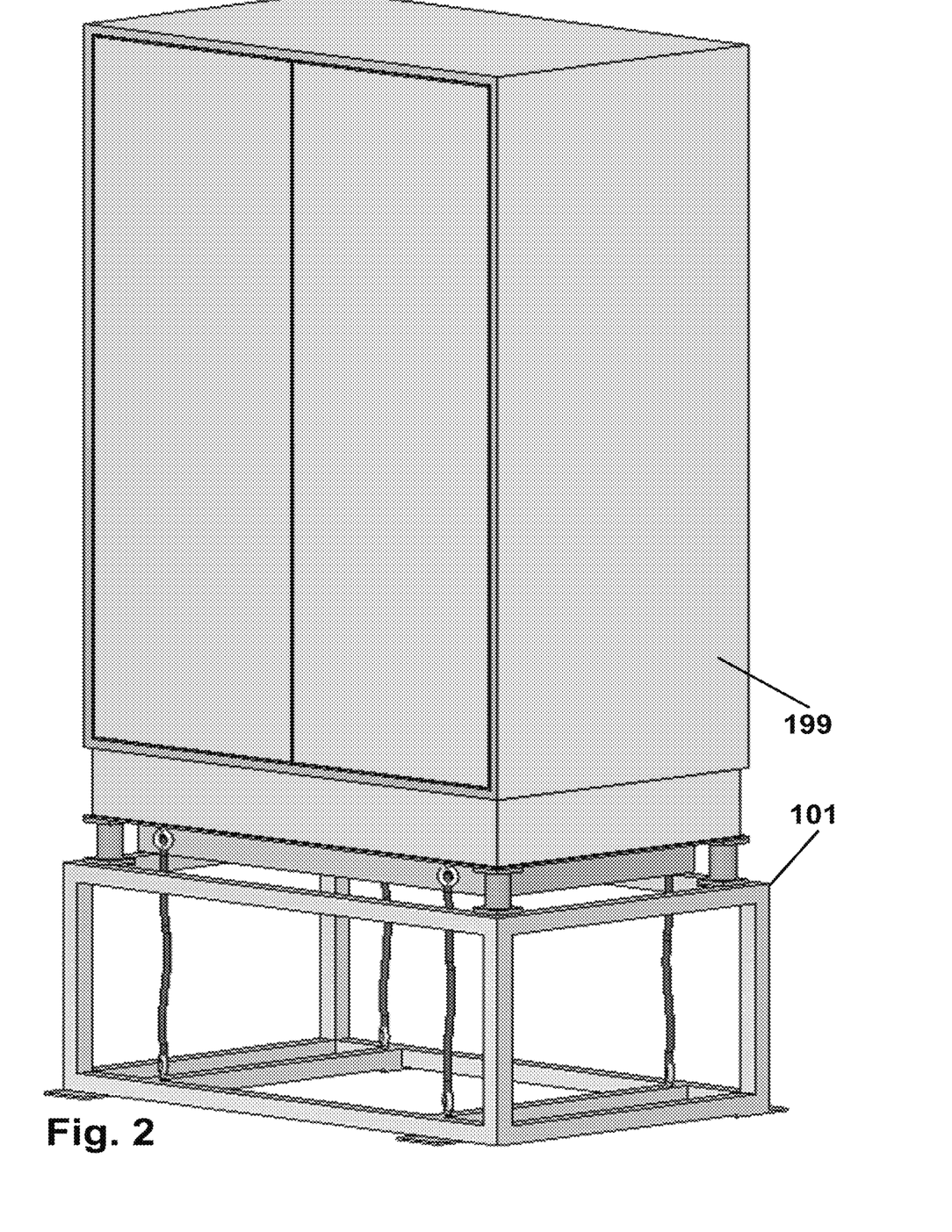
FIG. 2 is a schematic illustration of an equipment rack mounted on top of a Support Device, in accordance with some demonstrative embodiments; shown in an idle state, in which no external vibrations or forces are applied.

Reference is made to FIG. 2, which is a schematic illustration of an equipment rack 199 mounted on top of Support Device 101, in accordance with some demonstrative embodiments; in an idle state, in which no external vibrations or forces are applied. The cables 131 are not subject to tension; and the dampers 130 are generally vertical and not slanted; and the equipment rack 199 is generally vertical and not slanted.

Figure 3:
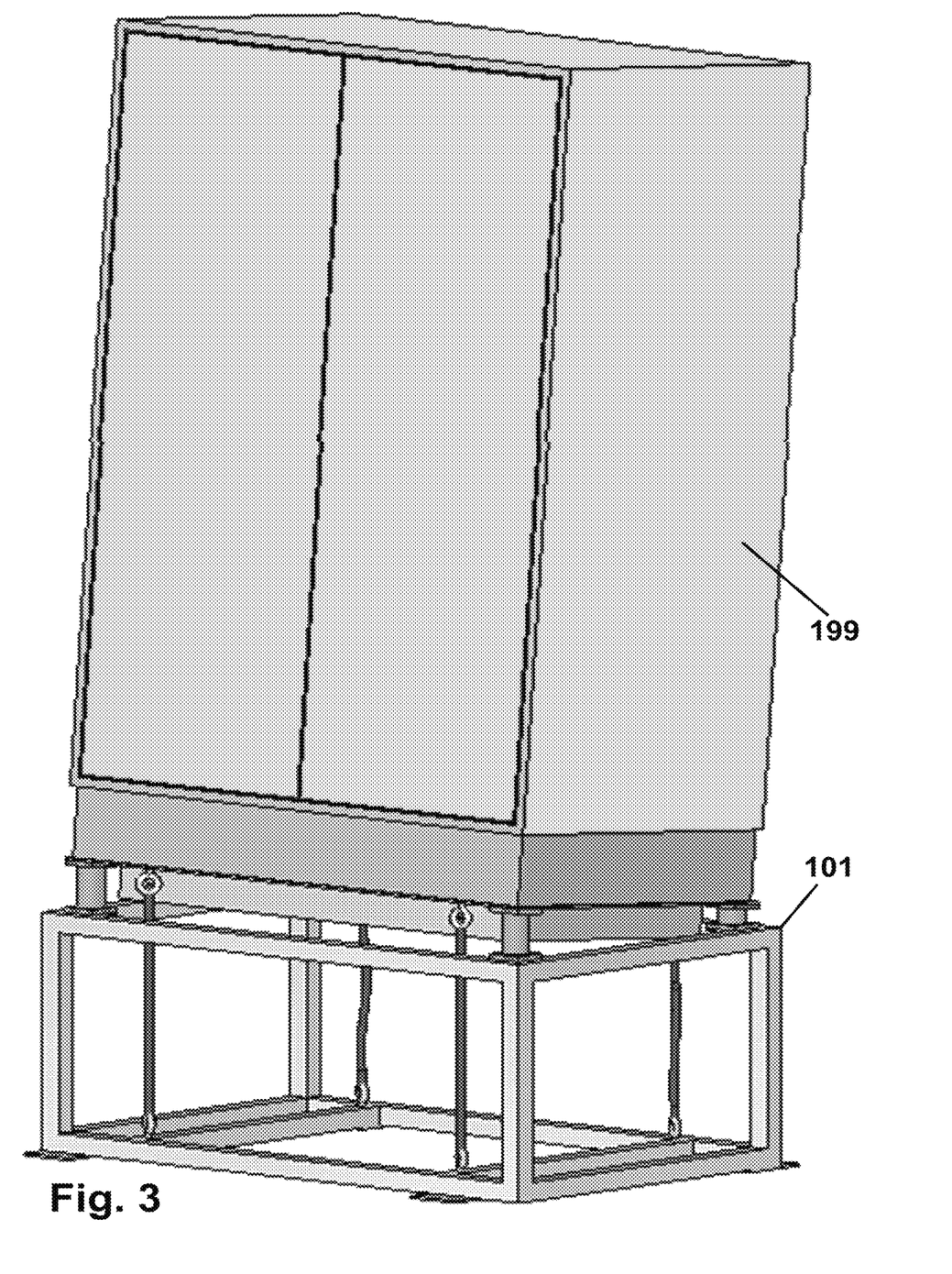
FIG. 3 is a schematic illustration of an equipment rack mounted on top of a Support Device, in accordance with some demonstrative embodiments; in a non-idle state, in which external vibrations or forces are applied.

Reference is made to FIG. 3, which is a schematic illustration of equipment rack 199 mounted on top of Support Device 101, in accordance with some demonstrative embodiments; in a non-idle state, in which external vibrations or forces are applied. The cables 131 are subject to tension; and the dampers 130 are generally non-vertical and are slanted; and the equipment rack 199 is slightly slanted. For example, two of the four dampers 130 are compressed relative to their idle state; and two other of the four dampers are extended relative to their idle state. For example, two of the four cables 131 are extended due to tension, and are linear and straight, relative to their idle state or idle length; and two other of the four cables are slightly looser and non-tensed, relative to their idle state, and are non-linear or non-straight.

For example, during the spatial movement of the equipment rack 199, when any of the cables 131 is pulled and acts under tension, it does not create a sharp stop of the payload movement; as translation or rotation replaces the initial movement, thereby reducing the impulse loads on the payload; and this is in contrast with a situation in which solid travel movement limiter or a motion stopper is utilized.

Figure 4:
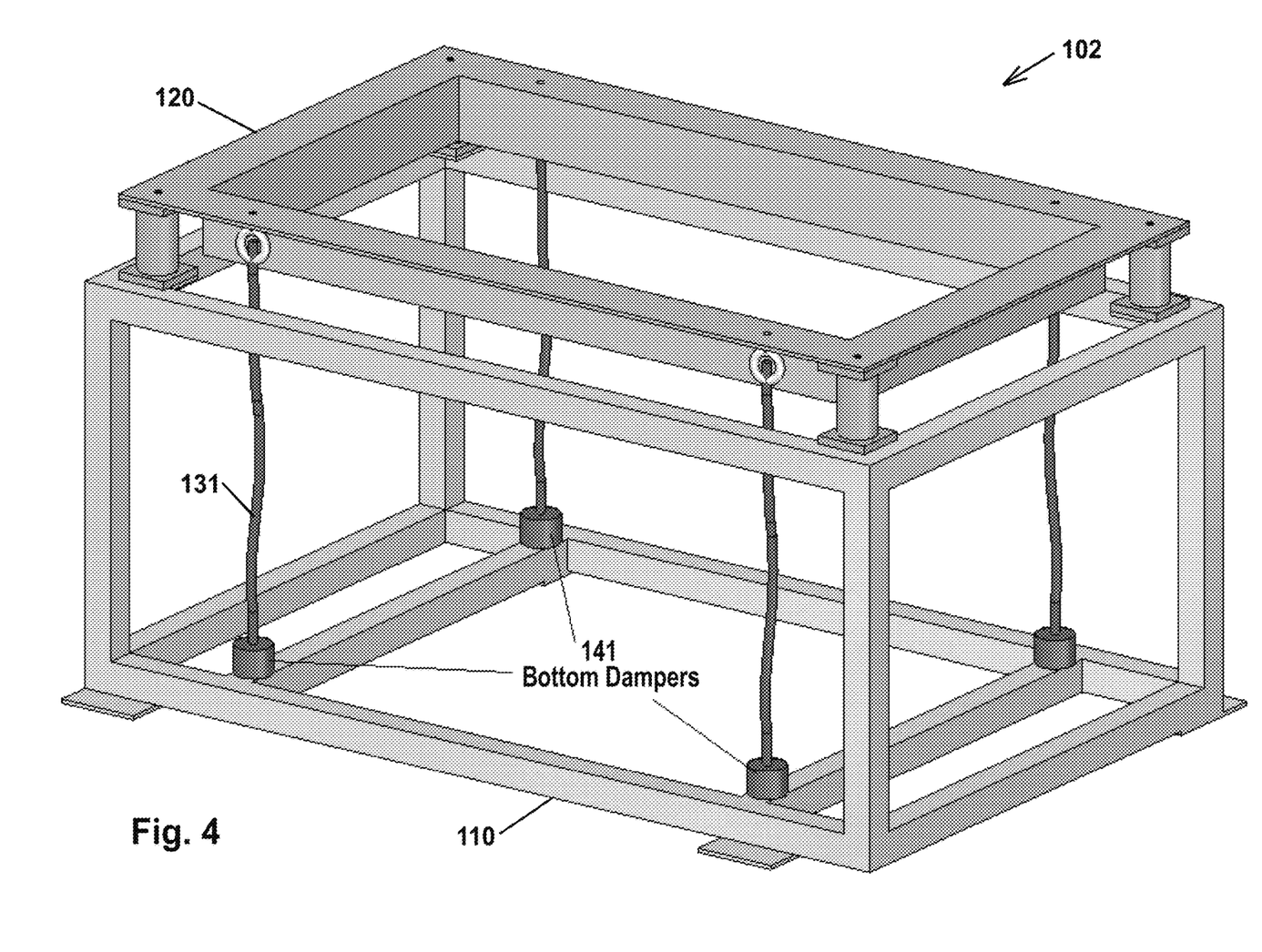
FIG. 4 is a schematic illustration of another Support Device, in accordance with some demonstrative embodiments.

Reference is made to FIG. 4, which is a schematic illustration of a Support Device 102, in accordance with some demonstrative embodiments. Support Device 102 may include the fixed non-moving hollow box 110, and the upper movable frame 120, as well as the four vertical cables 131, similar to those of Support Device 102 described above and shown in FIG. 1. However, in the embodiments shown in FIG. 4, each cable 131 of Support Device 102 is connected at its lower end to a lower-side damper 141 or other bottom-side damping unit or damping element; thereby enabling a gradual increase (or modification) of the restraining force(s) that are contributed by the inverted pendulum mechanism, and/or thereby providing (in some situations) an improved capacity to dissipate vibration energy or mechanical-shock energy; as such energy is dissipated in concert by both the cable 131 and the lower-side damper 141. Additionally or alternatively, the lower-side dampers 141 may provide an increased ability to configure or modify or adjust the restraining parameters of payload movement.

It is noted that in some embodiments, the various dampers or damping units or damping elements, that are described or utilized in any of the embodiments shown or described, may be or may include, for example, a spring, a linear characteristic damper, a non-linear characteristic damper, a piston or cylinder type damper, a set of multiple damping elements, or other suitable damping units that may be able to indirectly cause reduction of the payload movement velocity until it reaches a complete stop.

Figure 5:
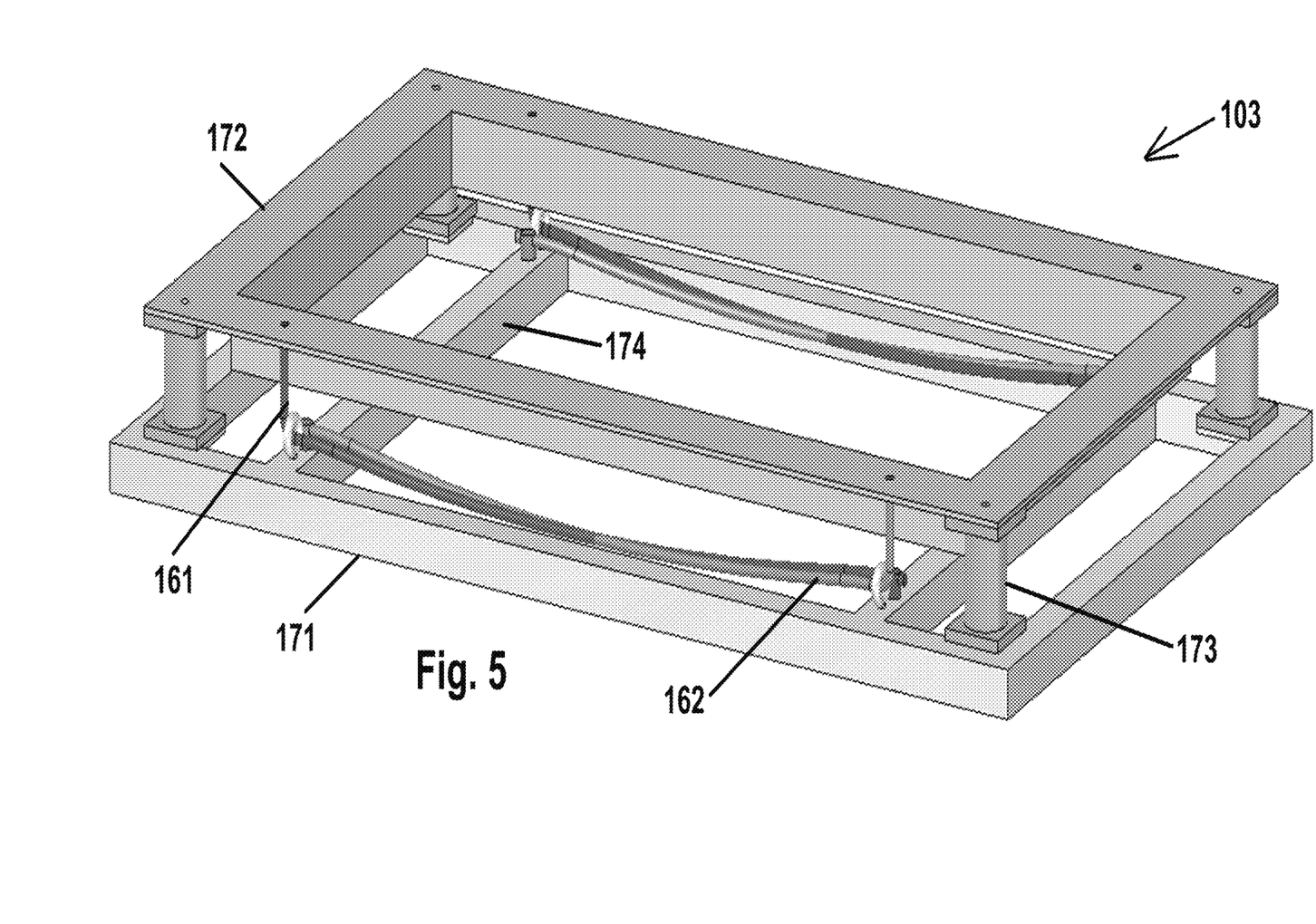
FIG. 5 is a schematic illustration of another Support Device, in accordance with some demonstrative embodiments.

Reference is made to FIG. 5, which is which is a schematic illustration of a Support Device 103, in accordance with some demonstrative embodiments. Support Device 103 may comprise a fixed, rectangular, lower-side metal frame 171, formed of four metal bars that are connected perpendicularly to each other form a rectangular frame. A movable non-fixed metal frame 172 is connected above the fixed metal frame 171, via four corner dampers 173. Additionally, four vertical cables 161 are connected vertically; each vertical cable 161 is connected at its upper end to the movable non-fixed metal frame 172; and each vertical cable 161 is connected at its lower end to one of two horizontal cross-bars 174 that are connected to the fixed lower-side metal frame 171. Additionally, two (or more) horizontal cables 162 are connected, generally horizontally, between the two lower-end points of two neighboring vertical cables 161 and are generally parallel to the longest dimension (or the longest metal bar) of the fixed metal frame 171. The combination of vertical corner dampers 173, with the vertical cables 161, and with the horizontal cables 162, operates in concert to dissipate or absorb vibration-based energy, vibrations, shaking, and/or other external forces; and/or operates to stabilize the Support Device 103 and/or equipment mounted on top of it, and/or operates to prevent tipping-over or falling of equipment mounted on top of Support Device 103. It is noted that in some embodiments, optionally, the vertical cables 161 may be combined with or added to Support Devices 101 or 102 discussed above, as an additional component or mechanism that assists in absorption or dissipation of mechanical forces or shocks or vibrations or as stabilizing elements.

Figure 6:
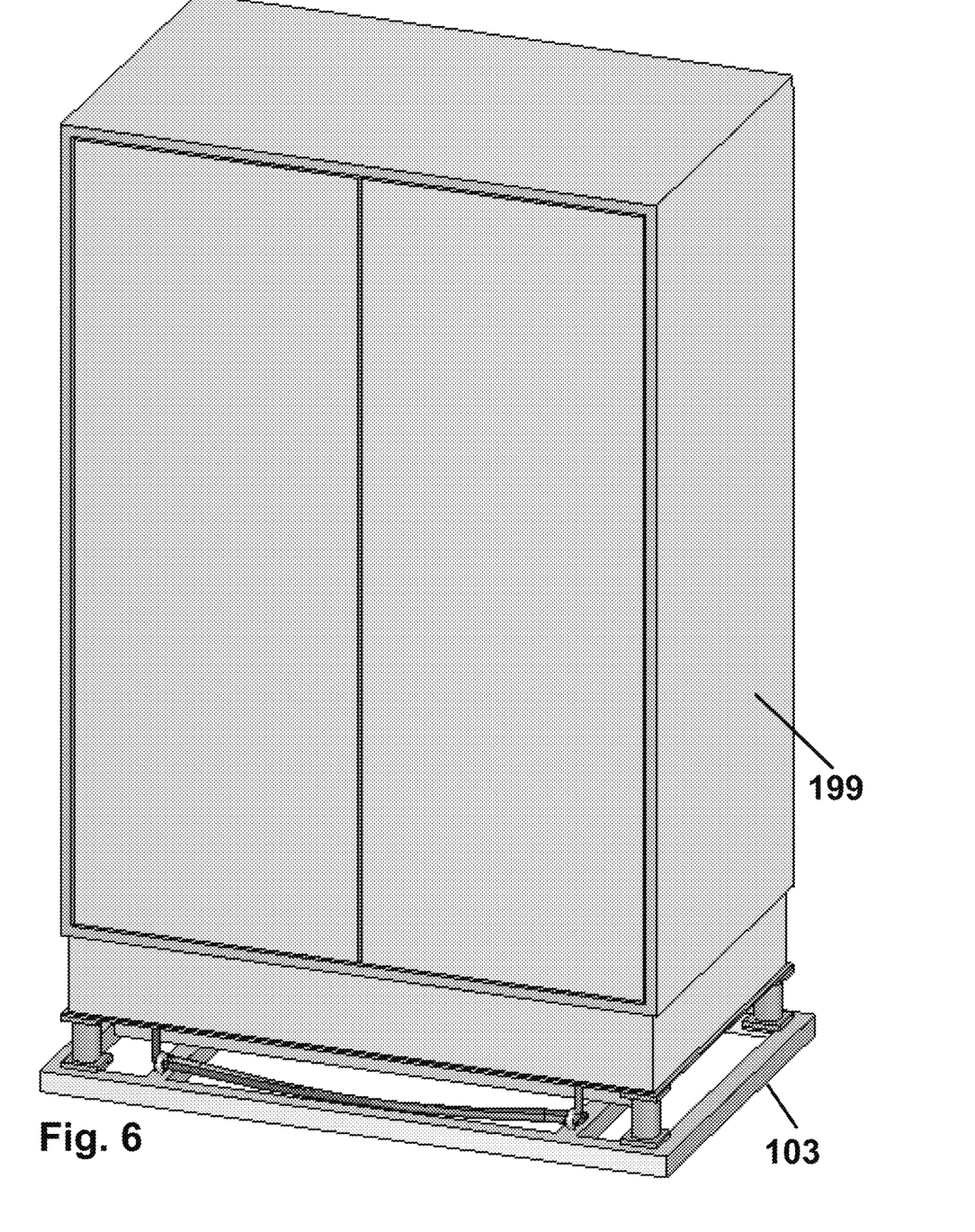
FIG. 6 is a schematic illustration of an equipment rack mounted on top of a Support Device 103, in accordance with some demonstrative embodiments; shown in an idle state, in which no external vibrations or forces are applied.

Reference is made to FIG. 6, which is a schematic illustration of equipment rack 199 mounted on top of Support Device 103, in accordance with some demonstrative embodiments; in an idle state, in which no external vibrations or forces are applied. The vertical cables 161 and the horizontal cables 162 are not subject to tension; and the dampers 173 are generally vertical and not slanted; and the equipment rack 199 is generally vertical and not slanted.

Some embodiments provide a support device for supporting thereon a rack or other equipment. In some embodiments, the support device comprises: (a) a non-moving rectangular metal hollow-box frame, having two horizontal and parallel cross-bars at a lower metal frame thereof; and (b) an upper movable metal frame; (c) four vibration-energy-dissipating corner dampers, each vibration-energy-dissipating corner damper connected at its lower end above a corner of the non-moving rectangular metal hollow-box frame, each vibration-energy-dissipating corner damper connected at its upper end beneath a corresponding corner of the upper movable metal frame; (d) four vertical vibration-energy-dissipating cables, each of the four vertical vibration-energy-dissipating cables connected vertically between: (i) an inner non-edge location of one of the two horizontal cross-bars of the lower metal frame of the non-moving rectangular metal hollow-box frame, and (ii) a metal panel of the upper movable metal frame.

In some embodiments, said vibration-energy-dissipating corner dampers absorb and dissipate mechanical forces up to a threshold value of energy; wherein said vertical vibration-energy-dissipating cables remain generally idle until said threshold value of energy is reached; wherein at least one of said vertical vibration-energy-dissipating cables moves as an inverted, upside-down, pendulum once said threshold value of energy is exceeded.

In some embodiments, wherein each of said generally-vertical dampers is generally vertical in idle state; wherein at least one of said generally-vertical dampers compresses or bends itself in response to incoming forces applied to the support device; wherein each of said vertical vibration-energy-dissipating cables is generally vertical in idle state; wherein at least one of said vertical vibration-energy-dissipating cables vibrates sideways as an inverted upside-down pendulum in response to incoming forces applied to the support device.

In some embodiments, the support device comprises not more than four vibration-energy-dissipating dampers; wherein the four vibration-energy-dissipating dampers are implemented as said corner vibration-energy-dissipating dampers, and suffice to absorb mechanical shocks and energy up to said threshold value of energy.

In some embodiments, an entirety of the support device includes less than five dampers.

In some embodiments, an entirety of the support device includes less than five generally-vertical dampers; wherein each of said generally-vertical dampers is generally vertical in idle state.

In some embodiments, the support device comprises not more than four vertical vibration-energy-dissipating cables; wherein the four vertical vibration-energy-dissipating cables, together with up to four generally-vertical dampers, suffice to absorb mechanical shocks and energy and to prevent tipping-over of said rack or other equipment.

In some embodiments, an entirety of the support device includes less than five vertical vibration-energy-dissipating cables.

In some embodiments, an entirety of the support device includes less than five generally-vertical dampers; wherein each of said generally-vertical dampers is generally vertical in idle state; wherein at least one of said generally-vertical dampers compresses itself in response to incoming forces applied to the support device; wherein the entirety of the support device includes less than five vertical vibration-energy-dissipating cables; wherein each of said vertical vibration-energy-dissipating cables is generally vertical in idle state; wherein at least one of said vertical vibration-energy-dissipating cables vibrates as an inverted upside-down pendulum in response to incoming forces applied to the support device.

In some embodiments, the upper movable metal frame further comprises: four vertical panels, wherein each of said four vertical panels is connected perpendicularly to a corresponding horizontal metal bar of the upper movable metal frame; wherein said four vertical panels comprise: two long vertical panels that are parallel to each other, and two short vertical panel that are parallel to each other and that are perpendicular to the two long vertical panels; wherein the two short vertical panels are not connected to any of the vertical vibration-energy-dissipating cables; wherein two of the four vertical vibration-energy-dissipating cables are connected to one of the two long vertical panels; wherein two other of the four vertical vibration-energy-dissipating cables are connected to another one of the two long vertical panels.

In some embodiments, the upper movable metal frame further comprises: four vertical panels, forming a rectangle of vertical panels which has an area that is smaller than the area of upper movable metal frame; wherein the rectangle of vertical panels is internal relative to an upper movable metal frame; wherein each of said four vertical panels is connected perpendicularly to a corresponding horizontal metal bar of the upper movable metal frame; wherein said four vertical panels comprise: two long vertical panels that are parallel to each other, and two short vertical panel that are parallel to each other and that are perpendicular to the two long vertical panels; wherein the two short vertical panels are not connected to any of the vertical vibration-energy-dissipating cables; wherein two of the four vertical vibration-energy-dissipating cables are connected to one of the two long vertical panels; wherein two other of the four vertical vibration-energy-dissipating cables are connected to another one of the two long vertical panels.

In some embodiments, each of the four vertical vibration-energy-dissipating cables, is connected at its lower end to a metal ring that is connected to one of the two horizontal cross-bars of the lower metal frame of the non-moving rectangular metal hollow-box frame; wherein each metal ring enables each corresponding vertical vibration-energy-dissipating cable to move in pendulum movement in response to incoming forces or vibrations.

In some embodiments, each of the four vertical vibration-energy-dissipating cables, is connected at its lower end to a bottom-side damper that is connected to one of the two horizontal cross-bars of the lower metal frame of the non-moving rectangular metal hollow-box frame; wherein each bottom-side damper enables each corresponding vertical vibration-energy-dissipating cable to move in pendulum movement in response to incoming forces or vibrations.

In some embodiments, an entirety of the support device has not more than eight dumpers in total.

In some embodiments, an entirety of the support device has not more than 16 dumpers in total; wherein up to 8 of the 16 dumpers are bottom-side dampers, wherein each bottom-side damper is connected to a lower end of a corresponding vertical vibration-energy-dissipating cable; wherein up to 8 other of the 16 dampers are vibration-energy-dissipating corner dampers, which are not touching and are not connected directly to any of the vertical vibration-energy-dissipating cables.

In some embodiments, the support device further comprises: at least one vertical vibration-energy-dissipating cable, that is connected generally horizontally between two of the vertical vibration-energy-dissipating cables, and that further absorbs or dissipates, by stretching and compressing, mechanical forces and vibration energy that are applied to the support device.

In some embodiments, the support device is an autonomous pedestal that is attachable to said equipment and that is detachable from said equipment.

In some embodiments, the support device is an integrated component that is integrally and non-detachably connected beneath said equipment.

Some embodiments include a computer equipment rack, comprising: a cabinet frame holding one or more shelves; wherein said cabinet frame is mounted and connected on top of the support device.

In some embodiments, a method comprises: protecting sensitive equipment against mechanical forces and vibrations, by mounting and/or connecting said sensitive equipment on top of the support device.

In some embodiments, an entirety of the support device has less than 5 dampers; wherein each of said dampers is a generally-vertical damper which generally vertical in idle state.

In some embodiments, an entirety of the support device has less than 9 dampers; wherein each of said dampers is a generally-vertical damper which generally vertical in idle state.

In some embodiments, an entirety of the support device has less than 13 dampers; wherein each of said dampers is a generally-vertical damper which generally vertical in idle state.

In some embodiments, an entirety of the support device has less than 17 dampers; wherein each of said dampers is a generally-vertical damper which generally vertical in idle state.

In some embodiments, the support device has exactly 4 dampers in total. In some embodiments, the support device has exactly 6 dampers in total. In some embodiments, the support device has exactly 8 dampers in total. In some embodiments, the support device has exactly 10 dampers in total. In some embodiments, the support device has exactly 12 dampers in total. In some embodiments, the support device has exactly 16 dampers in total.

In some embodiments, the support device has not more than 4 dampers in total. In some embodiments, the support device has not more than 6 dampers in total. In some embodiments, the support device has not more than 8 dampers in total. In some embodiments, the support device has not more than 10 dampers in total. In some embodiments, the support device has not more than 12 dampers in total. In some embodiments, the support device has not more than 16 dampers in total.

In some embodiments, the support device has exactly 4 dampers that are not connected to any vertical cable. In some embodiments, the support device has exactly 6 dampers that are not connected to any vertical cable. In some embodiments, the support device has exactly 8 dampers that are not connected to any vertical cable. In some embodiments, the support device has exactly 10 dampers that are not connected to any vertical cable. In some embodiments, the support device has exactly 12 dampers that are not connected to any vertical cable. In some embodiments, the support device has exactly 16 dampers that are not connected to any vertical cable.

In some embodiments, the support device has up to 4 dampers that are not connected to any vertical cable. In some embodiments, the support device has up to 6 dampers that are not connected to any vertical cable. In some embodiments, the support device has up to 8 dampers that are not connected to any vertical cable. In some embodiments, the support device has up to 10 dampers that are not connected to any vertical cable. In some embodiments, the support device has up to 12 dampers that are not connected to any vertical cable. In some embodiments, the support device has up to 16 dampers that are not connected to any vertical cable.

In some embodiments, the support device has exactly 4 dampers that are connected to 4 respective vertical cables. In some embodiments, the support device has exactly 6 dampers that are connected to 6 respective vertical cables. In some embodiments, the support device has exactly 8 dampers that are connected to 8 respective vertical cables. In some embodiments, the support device has exactly 10 dampers that are connected to 10 respective vertical cables. In some embodiments, the support device has exactly 12 dampers that are connected to 12 respective vertical cables. In some embodiments, the support device has exactly 16 dampers that are connected to 16 respective vertical cables.

In some embodiments, the support device has up to 4 dampers that are connected to 4 respective vertical cables. In some embodiments, the support device has up to 6 dampers that are connected to 6 respective vertical cables. In some embodiments, the support device has up to 8 dampers that are connected to 8 respective vertical cables. In some embodiments, the support device has up to 10 dampers that are connected to 10 respective vertical cables. In some embodiments, the support device has up to 12 dampers that are connected to 12 respective vertical cables. In some embodiments, the support device has up to 16 dampers that are connected to 16 respective vertical cables.

In some embodiments, the support device has, for example: 4 or 6 or 8 or 12 or 16 upper-side dumpers, that are not connected to any vertical cables; and/or 4 or 6 or 8 or 12 or 16 lower-side dumpers, that are connected to respective lower-ends of vertical cables.

Functions, operations, components and/or features described herein with reference to one or more embodiments, may be combined with, or may be utilized in combination with, one or more other functions, operations, components and/or features described herein with reference to one or more other embodiments, or vice versa.

While certain features of some embodiments have been illustrated and described herein, many modifications, substitutions, changes, and equivalents may occur to those skilled in the art. Accordingly, the claims are intended to cover all such modifications, substitutions, changes, and equivalents.

What is claimed is:

1. A support device, for supporting thereon a rack or other equipment, the support device comprising:
   (a) a non-moving rectangular metal hollow-box frame, having two horizontal and parallel cross-bars at a lower metal frame thereof;
   (b) an upper movable metal frame;
   (c) four vibration-energy-dissipating corner dampers, each vibration-energy-dissipating corner damper connected at its lower end above a corner of the non-moving rectangular metal hollow-box frame, each vibration-energy-dissipating corner damper connected at its upper end beneath a corresponding corner of the upper movable metal frame;
   (d) four vertical vibration-energy-dissipating cables, each of the four vertical vibration-energy-dissipating cables connected vertically between: (i) an inner non-edge location of one of the two horizontal cross-bars of the lower metal frame of the non-moving rectangular metal hollow-box frame, and (ii) a metal panel of the upper movable metal frame;
   wherein the support device comprises not more than four vertical vibration-energy-dissipating cables;
   wherein the four vertical vibration-energy-dissipating cables, together the four vibration-energy-dissipating corner dampers, suffice to absorb mechanical shocks and energy and to prevent tipping-over of said rack or other equipment.

2. The support device of claim 1,
   wherein said vibration-energy-dissipating corner dampers absorb and dissipate mechanical forces up to a threshold value of energy;
   wherein said vertical vibration-energy-dissipating cables remain generally idle until said threshold value of energy is reached;
   wherein at least one of said vertical vibration-energy-dissipating cables moves as an inverted, upside-down, pendulum once said threshold value of energy is exceeded.

3. The support device of claim 1,
   wherein each of said vibration-energy-dissipating corner dampers is generally vertical in idle state;
   wherein at least one of said vibration-energy-dissipating corner dampers compresses or bends itself in response to incoming forces applied to the support device;
   wherein each of said vertical vibration-energy-dissipating cables is generally vertical in idle state;
   wherein at least one of said vertical vibration-energy-dissipating cables vibrates sideways as an inverted upside-down pendulum in response to incoming forces applied to the support device.

4. The support device of claim 1,
   wherein the support device comprises not more than four vibration-energy-dissipating dampers;
   wherein the four vibration-energy-dissipating dampers are implemented as said corner vibration-energy-dissipating dampers, and suffice to absorb mechanical shocks and energy up to said threshold value of energy.

5. The support device of claim 1,
   wherein an entirety of the support device has in total less than five dampers including said four vibration-energy-dissipating corner dampers;
   wherein each of said four vibration-energy-dissipating corner dampers is a generally-vertical damper which is generally vertical in idle state.

6. The support device of claim 1,
   wherein an entirety of the support device has in total less than nine dampers including said four vibration-energy-dissipating corner dampers;
   wherein each of said four vibration-energy-dissipating corner dampers is a generally-vertical damper which is generally vertical in idle state.

7. The support device of claim 1,
   wherein an entirety of the support device includes less than five vertical vibration-energy-dissipating cables.

8. The support device of The support device of claim 1,
   wherein an entirety of the support device includes less than five dampers including said four vibration-energy-dissipating corner dampers;
   wherein each of said four vibration-energy dissipating corner dampers is a generally-vertical damper which is generally vertical in idle state;
   wherein at least one of said generally-vertical dampers compresses itself in response to incoming forces applied to the support device;
   wherein the entirety of the support device includes less than five vertical vibration-energy-dissipating cables;
   wherein each of said vertical vibration-energy-dissipating cables is generally vertical in idle state;
   wherein at least one of said vertical vibration-energy-dissipating cables vibrates as an inverted upside-down pendulum in response to incoming forces applied to the support device.

9. The support device of claim 1,
wherein the upper movable metal frame further comprises:
four vertical panels,
wherein each of said four vertical panels is connected perpendicularly to a corresponding horizontal metal bar of the upper movable metal frame.

10. The support device of claim 1,
wherein the upper movable metal frame further comprises:
four vertical panels, forming a rectangle of vertical panels which has an area that is smaller than an area of the upper movable metal frame; wherein the rectangle of vertical panels is internal relative to said upper movable metal frame;
wherein each of said four vertical panels is connected perpendicularly to a corresponding horizontal metal bar of the upper movable metal frame.

11. The support device of claim 1,
wherein each of the four vertical vibration-energy-dissipating cables, is connected at its lower end to a metal ring that is connected to one of the two horizontal cross-bars of the lower metal frame of the non-moving rectangular metal hollow-box frame;
wherein each metal ring enables each corresponding vertical vibration-energy-dissipating cable to move in pendulum movement in response to incoming forces or vibrations.

12. A support device, for supporting thereon a rack or other equipment,
the support device comprising:
(a) a non-moving rectangular metal hollow-box frame, having two horizontal and parallel cross-bars at a lower metal frame thereof;
(b) an upper movable metal frame;
(c) four vibration-energy-dissipating corner dampers,
each vibration-energy-dissipating corner damper connected at its lower end above a corner of the non-moving rectangular metal hollow-box frame,
each vibration-energy-dissipating corner damper connected at its upper end beneath a corresponding corner of the upper movable metal frame;
(d) four vertical vibration-energy-dissipating cables,
each of the four vertical vibration-energy-dissipating cables connected vertically between: (i) an inner non-edge location of one of the two horizontal cross-bars of the lower metal frame of the non-moving rectangular metal hollow-box frame, and (ii) a metal panel of the upper movable metal frame;
wherein each of the four vertical vibration-energy-dissipating cables, is connected at its lower end to a bottom-side damper that is connected to one of the two horizontal cross-bars of the lower metal frame of the non-moving rectangular metal hollow-box frame;
wherein each bottom-side damper enables each corresponding vertical vibration-energy-dissipating cable to move in pendulum movement in response to incoming forces or vibrations.

13. The support device of claim 1,
wherein an entirety of the support device has not more than eight dampers in total.

14. The support device of claim 1,
wherein an entirety of the support device has not more than 16 dampers in total, including said four vibration-energy-dissipating corner dampers.

15. A support device, for supporting thereon a rack or other equipment,
the support device comprising:
(a) a non-moving rectangular metal hollow-box frame, having two horizontal and parallel cross-bars at a lower metal frame thereof;
(b) an upper movable metal frame;
(c) four vibration-energy-dissipating corner dampers,
each vibration-energy-dissipating corner damper connected at its lower end above a corner of the non-moving rectangular metal hollow-box frame,
each vibration-energy-dissipating corner damper connected at its upper end beneath a corresponding corner of the upper movable metal frame;
(d) four vertical vibration-energy-dissipating cables,
each of the four vertical vibration-energy-dissipating cables connected vertically between: (i) an inner non-edge location of one of the two horizontal cross-bars of the lower metal frame of the non-moving rectangular metal hollow-box frame, and (ii) a metal panel of the upper movable metal frame;
(e) at least one generally horizontal vibration-energy-dissipating cable,
that is connected generally horizontally between two of the vertical vibration-energy-dissipating cables,
and that further absorbs or dissipates, by stretching and compressing, mechanical forces and vibration energy that are applied to the support device.

16. The support device of claim 1,
wherein the support device is an autonomous pedestal that is attachable to said equipment and that is detachable from said equipment.

17. The support device of claim 1,
wherein the support device is an integrated component that is integrally and non-detachably connected beneath said equipment.

18. A computer equipment rack, comprising:
a cabinet frame holding one or more shelves;
wherein said cabinet frame is mounted and connected on top of the support device of claim 1.

19. A method comprising:
protecting sensitive equipment against mechanical forces and vibrations,
by mounting and connecting said sensitive equipment on top of the support device of claim 1.

* * * * *